United States Patent
Wang

(10) Patent No.: US 10,902,811 B2
(45) Date of Patent: Jan. 26, 2021

(54) SHIFT REGISTER, GOA CIRCUIT, DISPLAY DEVICE AND DRIVING METHOD

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Jiguo Wang, Beijing (CN)

(73) Assignees: BOE TECHNOLOGY GROUP CO., LTD., Beijing (CN); ORDOS YUANSHENG OPTOELECTRONICS CO., LTD., Ordos Inner Mongolia (CN)

( * ) Notice: Subject to any disclaimer, the term of this patent is extended or adjusted under 35 U.S.C. 154(b) by 360 days.

(21) Appl. No.: 15/769,036

(22) PCT Filed: Oct. 10, 2017

(86) PCT No.: PCT/CN2017/105545
§ 371 (c)(1),
(2) Date: Apr. 17, 2018

(87) PCT Pub. No.: WO2018/176791
PCT Pub. Date: Oct. 4, 2018

(65) Prior Publication Data
US 2020/0258464 A1    Aug. 13, 2020

(30) Foreign Application Priority Data

Mar. 30, 2017    (CN) .......................... 2017 1 0202517

(51) Int. Cl.
*G09G 3/00*    (2006.01)
*G09G 3/3266*   (2016.01)
(Continued)

(52) U.S. Cl.
CPC .......... *G09G 3/3677* (2013.01); *G11C 19/28* (2013.01); *H04M 1/0266* (2013.01); *G09G 2310/0286* (2013.01); *G09G 2310/061* (2013.01)

(58) Field of Classification Search
CPC ... G02F 1/13306; G11C 19/28; G11C 19/287; G09G 3/006; G09G 3/3266; G09G 3/36;
(Continued)

(56) References Cited

U.S. PATENT DOCUMENTS

2001/0043496 A1* 11/2001 Cairns ...................... G09G 3/20
                                                                365/200
2003/0059986 A1*  3/2003 Shibata ............. H01L 29/78696
                                                                438/149
(Continued)

FOREIGN PATENT DOCUMENTS

CN    104700805 A    6/2015
CN    105529009 A    4/2016
(Continued)

OTHER PUBLICATIONS

Second Office Action for CN Application No. 201710202517.2, dated Aug. 29, 2108.
(Continued)

*Primary Examiner* — Michael J Eurice
(74) *Attorney, Agent, or Firm* — Dinsmore & Shohl LLP

(57) ABSTRACT

The present disclosure provides a shift register, a GOA circuit, a display device, and a driving method. A shift register is provided which comprises: at least one input sub-circuit for charging a pull-up node; at least one output sub-circuit for outputting a respective clock signal; first reset sub-circuit(s) for pulling the potential of the respective signal output terminal down to a reference potential; a first noise reduction sub-circuit for performing noise reduction
(Continued)

on the pull-up node through a signal input from the reference potential terminal; a second noise reduction sub-circuit for performing noise reduction on the pull-down node through a signal input from the reference potential terminal; and a second reset sub-circuit for controlling the potential of the pull-down node under control of a signal input from the reset clock signal input terminal.

12 Claims, 3 Drawing Sheets

(51) Int. Cl.
*G09G 3/36* (2006.01)
*G11C 19/28* (2006.01)
*H04M 1/02* (2006.01)

(58) Field of Classification Search
CPC .. G09G 3/3674; G09G 3/3677; G09G 3/3688; G09G 3/3696; G09G 2300/0408; G09G 2300/0871; G09G 2310/0251; G09G 2310/0281; G09G 2310/0283; G09G 2310/0286; G09G 2310/0289; G09G 2310/0291; G09G 2310/06; G09G 2310/061; G09G 2310/08; G09G 2320/0219; G09G 2330/02; G09G 2330/025; G09G 2330/04; G09G 2330/045; G09G 2330/08; H04M 1/0266
See application file for complete search history.

(56) References Cited

U.S. PATENT DOCUMENTS

| | | | | |
|---|---|---|---|---|
| 2004/0150610 | A1* | 8/2004 | Zebedee | G11C 19/28 345/100 |
| 2004/0239608 | A1* | 12/2004 | Chung | G11C 19/285 345/100 |
| 2007/0008268 | A1* | 1/2007 | Park | G11C 19/28 345/92 |
| 2007/0038909 | A1* | 2/2007 | Kim | G09G 3/3677 714/726 |
| 2007/0070021 | A1* | 3/2007 | Ahn | H03K 5/15093 345/100 |
| 2007/0147573 | A1* | 6/2007 | Tobita | G11C 19/28 377/64 |
| 2007/0164973 | A1* | 7/2007 | Tobita | G09G 3/3677 345/100 |
| 2007/0217564 | A1* | 9/2007 | Tobita | G11C 19/28 377/64 |
| 2007/0248204 | A1* | 10/2007 | Tobita | G11C 19/28 377/64 |
| 2008/0101529 | A1* | 5/2008 | Tobita | G11C 19/28 377/64 |
| 2008/0219401 | A1* | 9/2008 | Tobita | G11C 19/28 377/79 |
| 2009/0189677 | A1* | 7/2009 | Lee | G09G 3/3677 327/427 |
| 2010/0141641 | A1* | 6/2010 | Furuta | G11C 19/184 345/213 |
| 2010/0166136 | A1* | 7/2010 | Tobita | G11C 19/184 377/67 |
| 2011/0142191 | A1* | 6/2011 | Tobita | G11C 19/28 377/64 |
| 2011/0228893 | A1* | 9/2011 | Tobita | G11C 19/28 377/77 |
| 2011/0274234 | A1* | 11/2011 | Sakamoto | H01L 27/12 377/64 |
| 2012/0082287 | A1* | 4/2012 | Moriwaki | H01L 29/78696 377/64 |
| 2012/0140052 | A1* | 6/2012 | Baek | H04N 13/398 348/58 |
| 2015/0028933 | A1* | 1/2015 | Chen | H03K 17/162 327/382 |
| 2015/0123886 | A1* | 5/2015 | Chen | G09G 3/3674 345/92 |
| 2015/0187298 | A1* | 7/2015 | Eom | G09G 3/3266 345/99 |
| 2015/0364078 | A1* | 12/2015 | Shim | G09G 3/2092 345/211 |
| 2016/0189795 | A1* | 6/2016 | Chen | G11C 19/287 377/70 |
| 2016/0358571 | A1* | 12/2016 | Yu | G11C 19/184 |
| 2017/0372654 | A1* | 12/2017 | So | G09G 3/3266 |
| 2018/0040272 | A1* | 2/2018 | Lin | G11C 19/28 |
| 2018/0121023 | A1* | 5/2018 | Kim | G06F 3/044 |
| 2018/0122323 | A1* | 5/2018 | Park | H01L 27/1248 |

FOREIGN PATENT DOCUMENTS

| | | |
|---|---|---|
| CN | 105609135 A | 5/2016 |
| CN | 106340273 A | 1/2017 |
| CN | 106548747 A | 3/2017 |
| CN | 106683634 A | 5/2017 |
| JP | 2009-134814 A | 6/2009 |

OTHER PUBLICATIONS

CN First Office Action for CN. Appl. No. CN201710202517.2, dated Mar. 2, 2018.
International Search Report and Written Opinion for PCT/CN2017/105545, dated Jan. 12, 2018.

* cited by examiner

SHIFT REGISTER, GOA CIRCUIT, DISPLAY DEVICE AND DRIVING METHOD

CROSS-REFERENCE TO RELATED APPLICATIONS

This application is a U.S. National Stage under 35 U.S.C. § 371 of International Patent Application No. PCT/CN2017/105545, filed on Oct. 10, 2017, which claims priority to Chinese Patent Application No. 201710202517.2, filed on Mar. 30, 2017, the contents of which are incorporated herein by reference in their entirety for all purposes.

FIELD

The present disclosure belongs to the field of display technology, and in particular relates to a shift register, a GOA circuit, a display device, and a driving method.

BACKGROUND

The Gate Driver on Array (GOA) driving circuit uses a liquid crystal display array process to manufacture a gate scan driving signal circuit on an array substrate to scan pixel units in a row-by-row driving manner. The GOA driving circuit can reduce the welding process for an external integrated circuit, improve the degree of integration, but also can increase the production capacity and reduce the production cost. It is preferred for small and medium size liquid crystal display (LCD) products (such as mobile phones).

The inventors have found that at least the following problems exist in the prior art. In recent years, as the size of the LCD panel becomes larger and larger, the degree of integration becomes higher and higher, the circuit structure becomes more and more complicated, and requirements on reduction of power consumption and improvement of system stability are increased. The stability and lowing of power consumption of the GOA driving circuit in the prior art need to be further improved.

SUMMARY

The present disclosure is directed to the problem of further improvement in the stability and lowing of power consumption of the conventional GOA driving circuit, and provides a shift register, a GOA circuit, a display device, and a driving method.

According to an embodiment of the present disclosure, a shift register is provided that may comprise at least one input module, each input module being connected to a pull-up node and a respective signal input terminal for charging the pull-up node under control of an input signal input from the respective signal input terminal.

The shift register may further comprise at least one output module, each output module being connected to the pull-up node, a respective signal output terminal, a respective clock control signal terminal, and a respective first reset module for outputting a respective clock signal input from the respective clock control signal terminal through the respective signal output terminal under control of a potential of the pull-up node.

The shift register may further comprise a first reset module corresponding to each of the at least one output module, each first reset module being connected to a pull-down node, a reference potential terminal, and a first signal output terminal corresponding to the respective output module, for pulling the potential of the respective signal output terminal down to a reference potential under control of a potential of the pull-down node.

The shift register may further comprise a first noise reduction module connected to the reference potential terminal, the pull-down node, and the pull-up node, for performing noise reduction on the pull-up node through a signal input from the reference potential terminal under control of the potential of the pull-down node.

The shift register may further comprise a second noise reduction module connected to the pull-down node, the pull-up node, the reference potential terminal, and each of the at least one signal output terminal, for performing noise reduction on the pull-down node through a signal input from the reference potential terminal under control of signal(s) output from the at least one signal output terminal and the potential of the pull-up node.

The shift register may further comprise a second reset module connected to a reset clock signal input terminal and the pull-down node, for controlling the potential of the pull-down node under control of a signal input from the reset clock signal input terminal.

In an embodiment, the at least one input module comprises two input modules each comprising a first transistor, a control electrode and a first electrode of the first transistor being connected to a respective signal input terminal corresponding to the input module, the second electrode of the first transistor being connected to the pull-up node.

In an embodiment, the at least one output module comprises two output modules. Each of the output modules comprises a second transistor and a first capacitor. A control electrode of the second transistor is connected to the pull-up node. A second electrode of the second transistor is connected to a respective signal output terminal and a respective first reset module, and a first electrode of the second transistor is connected to a respective clock control signal terminal. A first end of the first capacitor is connected to the pull-up node, and a second end of the first capacitor is connected to a respective signal output terminal.

In an embodiment, the first reset module comprises a third transistor, a control electrode of the third transistor being connected to the pull-down node, and a first electrode of the third transistor being connected to a respective signal output terminal, and a second electrode of the third transistor being connected to the reference potential terminal.

In an embodiment, the second noise reduction module comprises a fourth transistor, a fifth transistor and a second capacitor; a control electrode of the fourth transistor is connected to a respective signal output terminal, a first electrode of the fourth transistor is connected to the pull-down node, and a second electrode of the fourth transistor is connected to the reference potential terminal; a control electrode of the fifth transistor is connected to the pull-up node, a first electrode of the fifth transistor is connected to the pull-down node, and a second electrode of the fifth transistor is connected to the reference potential terminal; a first end of the second capacitor is connected to the pull-down node, and a second end of the second capacitor is connected to the reference potential terminal.

In an embodiment, the first noise reduction module comprises a sixth transistor. A control electrode of the sixth transistor is connected to the pull-down node, a first electrode of the sixth transistor is connected to the pull-up node, and a second electrode of the sixth transistor is connected to the reference potential terminal.

In an embodiment, the second reset module comprises a seventh transistor. A control electrode and a first electrode of the seventh transistor are connected to the reset clock signal input terminal, and a second electrode of the seventh transistor is connected to the pull-down node.

In an embodiment, the at least one input module comprises two input modules, wherein: each of the input modules comprises a first transistor, a control electrode and a first electrode of the first transistor being connected to a signal input terminal corresponding to the respective input module, and a second electrode of the first transistor being connected to the pull-up node. The at least one output module comprises two output modules, wherein: each of the output modules comprises a second transistor and a first capacitor; a control electrode of the second transistor being connected to the pull-up node; a second electrode of the second transistor being connected to a respective signal output terminal and a respective first reset module, and a first electrode of the second transistor being connected to a respective clock control signal terminal; a first end of the first capacitor is connected to the pull-up node, and a second end of the first capacitor is connected to a respective signal output terminal. The first reset module comprises a third transistor, wherein: a control electrode of the third transistor is connected to the pull-down node, a first electrode of the third transistor is connected to a respective signal output terminal, and a second electrode of the third transistor is connected to the reference potential terminal. The first noise reduction module comprises a sixth transistor, wherein: a control electrode of the sixth transistor is connected to the pull-down node, a first electrode of the sixth transistor is connected to the pull-up node, and a second electrode of the sixth transistor is connected to the reference potential terminal. The second reset module comprises a seventh transistor, wherein: a control electrode and a first electrode of the seventh transistor are connected to the reset clock signal input terminal, and a second electrode of the seventh transistor is connected to the pull-down node. The second noise reduction module comprises a fourth transistor, a fifth transistor, a tenth transistor and a second capacitor, wherein: a control electrode of the fourth transistor is connected to a respective signal output terminal, a first electrode of the fourth transistor is connected to the pull-down node, and a second electrode of the fourth transistor is connected to the reference potential terminal. A control electrode of the fifth transistor is connected to the pull-up node, a first electrode of the fifth transistor is connected to the pull-down node, and a second electrode of the fifth transistor is connected to the reference potential terminal. A control electrode of the tenth transistor is connected to a respective signal output terminal, a first electrode of the tenth transistor is connected to the pull-down node, and a second electrode of the tenth transistor is connected to the reference potential terminal. A first end of the second capacitor is connected to the pull-down node, and a second end of the second capacitor is connected to the reference potential terminal.

In an embodiment, the two output modules include a first output module and a second output module which respectively receive a first clock signal and a second clock signal through the respective clock control signal terminals. The second reset module receives a fourth clock signal through the reset clock signal input terminal. The second clock signal has a same frequency as and a phase difference of ¼ cycle from the first clock signal. The fourth clock signal has a same frequency as and a phase difference of ¾ cycles from the first clock signal.

According to another embodiment of the present disclosure, an Gate Driver on Array (GOA) circuit is provided that comprises a plurality of cascaded shift registers according to any one of claims 1-9, wherein a signal output terminal of a shift register of a stage is connected to a respective signal input terminal of a shift register of a next stage.

According to yet another embodiment of the present disclosure, a method for driving a shift register. The shift register may be a shift register according to any embodiment of the present disclosure. The at least one output module comprises a first output module and a second output module which, respectively, receive a first clock signal and a second clock signal through the respective clock control signal terminals. The method may comprise: in a first phase, setting a signal inputted from a first signal input terminal to be high, a first clock signal to be low, a second clock signal to be low, and a fourth clock signal inputted from the reset clock signal input terminal to be high. The first input module charges the pull-up node under control of a signal input from the first signal input terminal to pull-down a potential of the pull-down node. The second noise reduction module performs noise reduction on the pull-down node through a signal input from the reference potential terminal under control of a potential of the pull-up node. A low-level signal is output at the first signal output terminal. A low-level signal is output at the second signal output terminal.

In a second phase, setting the signal input from the first signal input terminal to be low, the first clock signal to be high, the second clock signal to be low, and the fourth clock signal to be low. The first output module, under control of the potential of the pull-up node, outputs the first clock signal through the first signal output terminal. The second noise reduction module performs noise reduction on the pull-down node through a signal input from the reference potential terminal under control of the signal input from the first signal output terminal. A high level signal is output at the first signal output terminal. A low-level signal is output at the second signal output terminal.

In a third phase, setting the signal input from the first signal input to be low, the first clock signal to be low, the second clock signal to be high, and the fourth clock signal to be low. The second output module, under control of the potential of the pull-up node, outputs the second clock signal through the second signal output terminal. The second noise reduction module performs noise reduction on the pull-down node through the signal input from the reference potential terminal under control of the signal input from the second signal output terminal. A low-level signal is output at the first signal output terminal. A high level signal is output at the second signal output terminal.

According to a further embodiment of the present disclosure, a method for driving a Gate Driver on Array (GOA) circuit is provided. The GOA circuit comprises first and second shift registers according to any embodiment of the present disclosure, which are cascaded. The first shift register comprises a first output module and a second output module which receive a first clock signal and a second clock signal respectively from respective clock control signal terminals, and are respectively connected to a first signal output terminal and a second signal output terminal. The first shift register comprises a first input module and a second input module which receive a first input signal and a second input signal respectively from respective first signal input terminals.

The second shift register comprises a first output module and a second output module which receive a third clock signal and a fourth clock signal respectively from respective clock control signal terminals, and are respectively connected to a third signal output terminal and a fourth signal output terminal. The second reset module of the second shift register receives a second clock signal through a reset clock signal input terminal connected thereto. The second shift register comprises a first input module and a second input module which receive a third input signal and a fourth input signal respectively from respective signal input terminals. The signal input terminal of the first shift register, from which the second input signal is received, is connected to the third signal output terminal of the second shift register.

The method may comprise, in a first phase: the first input module charging the pull-up node under control of a signal input from the respective first signal input terminal; and the second reset module, under control of the fourth clock signal input from the reset clock signal input terminal, pulling down a potential of the pull-down node; the second noise reduction module performing noise reduction on the pull-down node through a signal input from the reference potential terminal under control of a potential of the pull-up node; a low-level signal being output at the first signal output terminal; a low-level signal being output at the second signal output terminal.

The method may further comprise, in a second phase: the first output module, under control of the potential of the pull-up node, outputting the first clock signal through the first signal output terminal, the second noise reduction module performing noise reduction on the pull-down node through a signal input from the reference potential terminal under control of a signal input from the first signal output terminal; a high level signal being output at the first signal output terminal; a low-level signal being output at the second signal output terminal.

The method may further comprise, in a third phase: the second output module outputting a signal input from the second clock control signal terminal through the second signal output terminal under control of a potential of the pull-up node; the second noise reduction module performing noise reduction on the pull-down node through a signal input from the reference potential terminal under control of a signal input from the second signal output terminal; a low-level signal being output at the first signal output terminal; a high level signal being output at the second signal output terminal.

The method may further comprise, in a fourth phase: the second output module outputting a signal input from the third clock control signal terminal through the second signal output terminal under control of a potential of the pull-up node; the second noise reduction module performs noise reduction on the pull-down node through a signal input from the reference potential terminal under control of a potential of the pull-up node; a high level signal being output at the first signal output terminal; a low-level signal being output at the second signal output terminal.

The method may further comprise, in a fifth phase: the second reset module pulling a potential at the pull-down node to high under control of a signal input from the reset clock signal input terminal; the first reset module pulling potentials of the first signal output terminal and the second signal output terminal to low through a signal input from the reference potential terminal under control of a potential of the pull-down node.

In an embodiment, the first clock signal, the second clock signal, the third clock signal, and the fourth clock signal have a same frequency and their phases are sequentially different by ¼ cycle.

According to another embodiment of the present disclosure, a display panel is provided that may comprises the shift register of any embodiment of present disclosure.

According to yet another embodiment of the present disclosure, a display device is provided that may comprises the display panel of any embodiment of present disclosure.

The shift registers according to some embodiments of the present disclosure may include multiple input modules, multiple output modules, a first noise reduction module, and a second noise reduction module. Multiple output modules allow the shift register to have a plurality of output control points, thus the switching of the multi-row gate lines can be controlled and the drive control capability of a single-stage shift register can be increased. Also, the layout space of the shift register can be effectively saved. On the other hand, multiple output modules respectively control the pull-down node through noise reduction module feedbacks, so that the anti-noise ability of the circuit is significantly increased and the output is more stable. Therefore, the panel yield is greatly improved. The shift register according to embodiments of the present disclosure can be applied to various display devices.

Other features of the present disclosure and the advantages thereof will become apparent from the following detailed description of exemplary embodiments of the present disclosure with reference to the accompanying drawings.

BRIEF DESCRIPTION OF DRAWINGS

The accompanying drawings, which constitute part of this specification, describe exemplary embodiments of the present disclosure and, together with the description, serve to explain the principles of the invention, in which.

Figure 1:
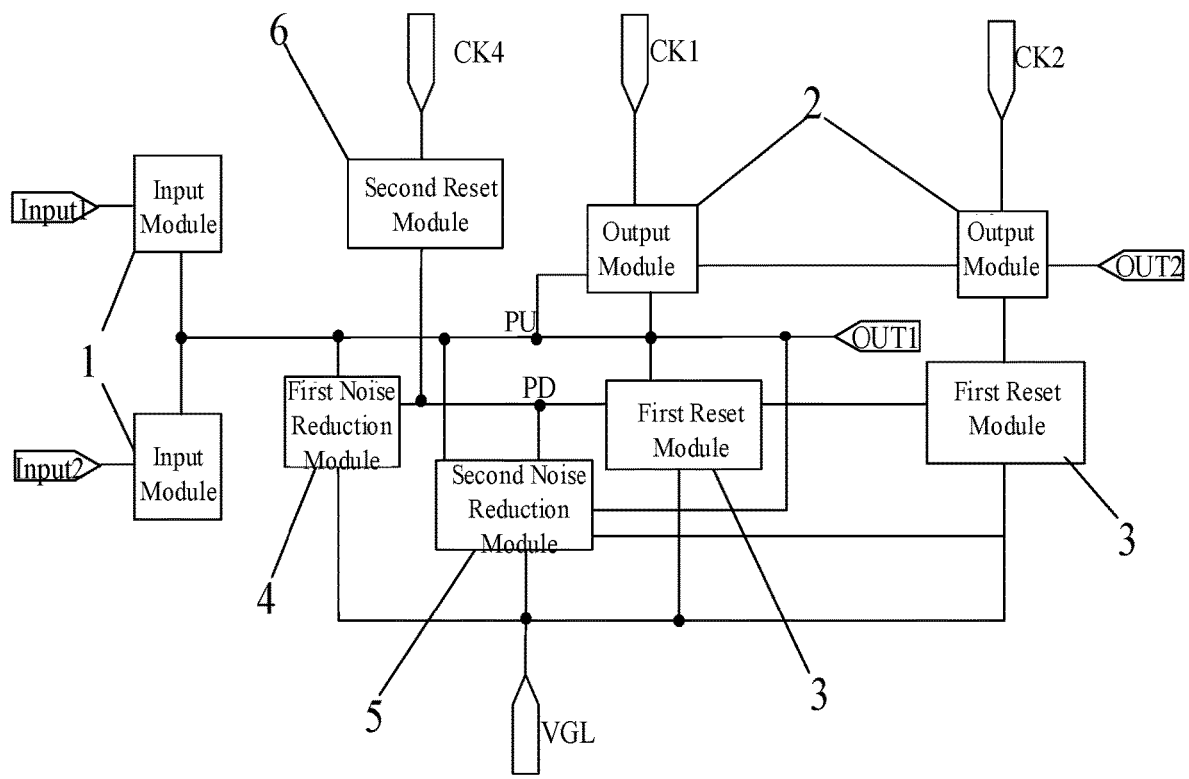
FIG. 1 is a schematic structural diagram of a shift register according to an embodiment of the present disclosure.

Note that in the embodiments described below, sometimes the same reference numerals are used to denote same portions or portions having the same functions throughout different drawings, and repeated descriptions thereof are omitted. In this specification, like numerals and letters are used to indicate like items, and therefore, once an item is defined in one figure, it need not be further discussed in subsequent figures.

DESCRIPTION OF EXEMPLARY EMBODIMENTS

Hereinafter, embodiments of the present disclosure will be described in detail in this specification with reference to the accompanying drawings. It should be understood, however, that the description of various embodiments is merely illustrative and is not intended to limit the invention claimed herein in any sense. Unless specifically stated otherwise or the context or the principle thereof is expressed or implied otherwise, the relative arrangement, expressions, numerical values, and the like of components and steps in the exemplary embodiments are not intended to limit the invention to be protected by the present application. In this specification, techniques, methods, and devices known to those of ordinary skills in the related art may not be discussed in detail, but the techniques, methods and devices should be considered part of the specification where appropriate.

The terminology used herein is for the purpose of describing particular embodiments only and is not intended to limit the disclosure. It is to be understood that when the term "comprises/comprising" is used herein, it is intended that there be stated feature, integer, step, operation, unit, and/or component, but does not preclude the presence or addition of one or more other features, integers, steps, operations, units and/or components and/or combinations thereof.

In the present disclosure, ordinal numbers such as "first", "second", "third", and the like are used in order to avoid confusion of elements and are not intended to indicate any order of priority in any aspects.

According to an embodiment of the present disclosure, a shift register is provided as shown in FIG. 1. The shift register may include: a plurality of input modules 1, a plurality of output modules 2, a first reset module 3 corresponding to each input module 1, a first noise reduction module 4, a second noise reduction module 5, and a second reset module 6.

In this embodiment, an example in which the shift register includes two input modules 1 and two output modules 2 will be described. The case where three or more input modules 1 or output modules 2 are included is similar to this embodiment.

Each of the input modules 1 is connected to a pull-up node PU and respectively to corresponding signal input terminals Input1 and Input2, and is configured for charging the pull-up node PU under control of the signal input from the signal input terminal.

The output modules 2 are connected to the pull-up node PU, and respectively to the corresponding signal output terminals OUT1 and OUT2, and the corresponding first clock control signal terminals CK1 and CK2, and the corresponding first reset modules 3. The output modules 2 are configured to output the signals input from the first clock control signal terminals CK1 and CK2 through the signal output terminals OUT1 and OUT2, respectively, under control of the potential of the pull-up node PU.

The first reset module 3 each are connected to the pull-down node PD, the reference potential terminal VGL, and the respective corresponding signal output terminals OUT1 and OUT2. The first reset modules 3 are used to pull down the potentials of the signal output terminals OUT1 and OUT2 through the signal input from the reference potential (for example, a lower potential or a ground potential) terminal VGL under control of the potential of the pull-down node PD. In other words, the first reset module 3 can be used to pull the potentials of the signal output terminals OUT1 and OUT2 down to a reference potential (for example, a lower potential or a ground potential) under control of the potential of the pull-down node PD.

The first noise reduction module 4 is connected to the reference potential terminal VGL, the pull-down node PD, and the pull-up node PU, and is configured for performing a noise reduction (performing a noise reduction on) on the pull-up node PU through the signal input from the reference potential terminal VGL, under control of the potential of the pull-down node PD.

The second noise reduction module 5 is connected to the pull-down node PD, the pull-up node PU, the reference potential terminal VGL, and the respective signal output terminals OUT1 and OUT2. The second noise reduction module 5 is configured to perform noise reduction on the pull-down node PD through the signal input from the reference potential terminal VGL, under control of the signals input from the respective signal output terminals OUT1 and OUT2 and the potential of the pull-up node PU.

The second reset module 6 is connected to a fourth clock signal input terminal (also referred to as a reset clock signal input terminal) CK4 and the pull-down node PD, and is configured for controlling the potential of the pull-down node PD under control of the fourth clock signal (CK4) input from the reset clock signal input terminal CK4.

The pull-up node PU is a connection node between each input module 1 and each output module 2. The pull-down node PD is a connection node between the first reset modules 3 and the second noise reduction module 5.

In other embodiments, the shift register may also include a plurality of the input modules, a plurality of the output modules, the first noise reduction module, and the second noise reduction module. A plurality of output modules may enable the shift register to have a plurality of output control points. Thus, the switching of a plurality of rows of gate lines may be controlled and the drive control capability of a single-stage shift register may be increased. Also, the layout space of the shift register may be effectively saved. In addition, the multiple output modules can respectively control the pull-down node with feedbacks through noise reduction modules, which significantly increases the anti-noise ability of the circuit, and makes the output more stable. As a result, the panel yield can be greatly increased.

Figure 2:
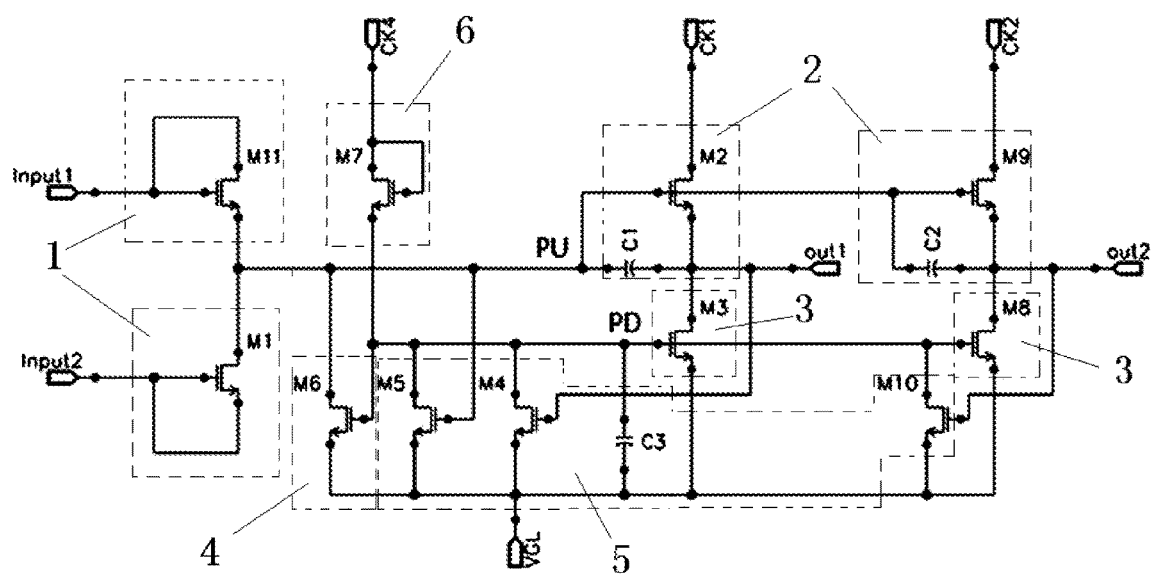
FIG. 2 is a schematic circuit diagram of a shift register according to an embodiment of the present disclosure; FIG.

According to another embodiment of the present disclosure, there is provided a shift register, as shown in FIG. 2, comprising: two input modules 1, two output modules 2, and a first reset module 3 corresponding to each input module 1, a first noise reduction module 4, a second noise reduction module 5, and a second reset module 6.

FIG. 2 shows an example of a specific implementation of a shift register according to an embodiment of the present disclosure. In FIG. 2, the upper left block is the first input module 1, the lower left block is the second input module 1, the upper middle block is the first output module 2, and the upper right block is the second output module 2.

The shift register of this embodiment has four clock control signal terminals CK1, CK2, CK3, and CK4, wherein CK1, CK2, CK3, and CK4 are clock signals that have the same frequency but are sequentially different by ¼ cycles.

Each input module 1 includes a first transistor whose control electrode (such as gate) and a first electrode (such as drain or source) are connected to a signal input terminal Input1 or Input2 corresponding to the input module 1. A second electrode (e.g., source or drain) of the first transistor is connected to the pull-up node PU.

Specifically, M1 and M11 in FIG. 2 each represent a first transistor. M11 is the first transistor for the first input module 1, and M1 is the first transistor for the second input module 1.

In an embodiment, each output module 2 includes a second transistor and a first capacitor.

Specifically, M2 and M9 in FIG. 2 each represent a second transistor. M2 is the second transistor for the first output module 2, and M9 is the second transistor for the second output module 2. Both C1 and C2 in FIG. 2 represent the first capacitors, wherein C1 is the first capacitor for the first output module 2, and C2 is the first capacitor for the second output module 2. In addition, it should be understood that although in the embodiment as shown in FIG. 2, the first capacitors C1, C2 are shown as independent capacitors, the present disclosure is not limited thereto. In some embodiments, the first capacitors C1, C2 may also be implemented as parasitic capacitances of related switches (e.g., transistors). This is also true for capacitor C3 which will be described below.

Control electrodes of the second transistors are connected to the PU node. Second electrodes of the second transistors are connected to the respective signal output terminals and the respective first reset modules 3. First electrodes of the second transistors are connected to respective clock control signal terminals, such as CK1 and CK2.

Specifically, transistor M2 is connected to Out1. Transistor M9 is connected to Out2.

The first terminals of the first capacitors C1 and C2 re connected to the PU node, and the second terminals of the first capacitors are connected to respective signal output terminals Out1 and Out2.

In an embodiment, the first reset module 3 may include a third transistor. A control electrode of the third transistor is connected to the pull-down node PD, and a first electrode of the third transistor is connected to a corresponding signal output terminal, and a second electrode of the third transistor is connected to the reference potential terminal.

Specifically, M3 and M8 each represent a third transistor. M3 corresponds to a first one of the output modules 2, and serves as the first reset module 3 for the first output module 2. M8 corresponds to a second one of the output modules 2, and serves as the first reset module 3 for the second output module 2. M3 is connected to Out1 and M8 is connected to Out2.

In an embodiment, the first noise reduction module 4 includes a sixth transistor M6.

A control electrode of the sixth transistor is connected to the pull-down node PD, a first electrode of the sixth transistor is connected to the pull-up node PU, and a second electrode of the sixth transistor is connected to the reference potential terminal VGL.

In an embodiment, the second reset module includes a seventh transistor. The control electrode and the second electrode of the seventh transistor are connected to the reset clock signal input terminal CK4, and the second electrode of the seventh transistor is connected to the pull-down node PD.

In an embodiment, the second noise reduction module 5 includes fourth transistors (M4 and M10), a fifth transistor M5 and a third capacitor C3.

A control electrode of the fourth transistor is connected to a corresponding signal output terminal, a first electrode of the fourth transistor is connected to the pull-down node PD, and a second electrode of the fourth transistor is connected to the reference potential terminal VGL.

Specifically, M4 and M10 each represent a fourth transistor, wherein M4 is connected to Out1, and M10 is connected to Out2.

A control electrode of the fifth transistor M5 is connected to the pull-up node PU, a first electrode of the fifth transistor M5 is connected to the pull-down node PD, and a second electrode of the fifth transistor M5 is connected to the reference potential terminal VGL.

A first end of the third capacitor C3 is connected to the pull-down node PD, and the second end of the third capacitor is connected to the reference potential terminal VGL.

According to an embodiment of the present disclosure, there is provided a GOA circuit that may include a plurality of cascaded shift registers according to any embodiment of the present disclosure.

Figure 3:
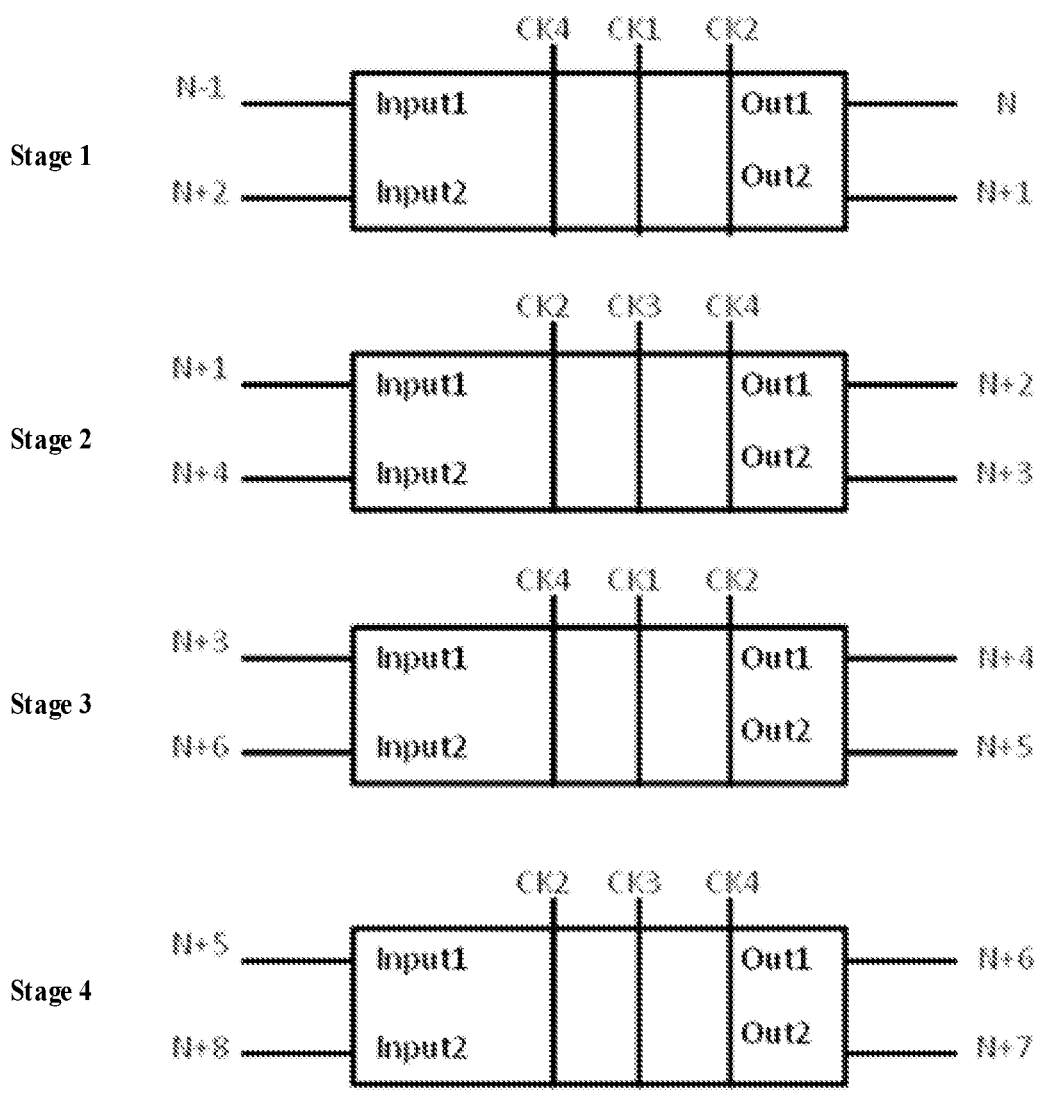
FIG. 3 is a schematic diagram of a GOA according to an embodiment of the present disclosure.

FIG. 3 shows a schematic diagram of a GOA according to an embodiment of the present disclosure. The GOA shown in FIG. 3 includes four cascaded shift registers. As shown in FIG. 3, odd-numbered shift registers (such as Level 1 and Level 3 shift registers) can be controlled by the clock control signals CK1, CK2, and CK4. Even-numbered shift registers (such as stage 2 and stage 4 shift registers) can be controlled by the clock control signals CK3, CK4, and CK2, and so on. It should be understood here that the clock control signals CK1-CK4 are only examples of applicable clock signals; and in other embodiments, different control signals may be used as needed.

In the embodiment shown in FIG. 3, the first input terminal Input1 of the current stage shift register receives the second output signal of the previous stage shift register, and the second input terminal Input2 of the current stage shift register receives the first output signal output from the next stage shift register. Out1 is the first output terminal of the current stage shift register, which outputs the first output signal. Out2 is the second output terminal of the current stage shift register, which outputs the second output signal. For example, the first input Input1 of the stage 1 shift register receives the second output signal N−1 of the shift register of the previous stage. The second input Input2 of the stage 1 shift register receives the first output signal N+2 output from the stage 2 shift register. The first output Out1 of the stage 1 shift register outputs the first output signal N of that stage. The second output Out2 of the stage 1 shift register outputs the second output signal N+1. The first input Input1 of the stage 2 shift register receives the second output signal N+1 of the stage 1 shift register. The second input Input2 of the stage 2 shift register receives the first output signal N+4 output from the stage 3 shift register. The first output Out1 of the stage 2 shift register outputs the first output signal N+2 of that stage. The second output Out2 of the stage 2 shift register outputs the second output signal N+3 of that stage. And so on.

Figure 4:
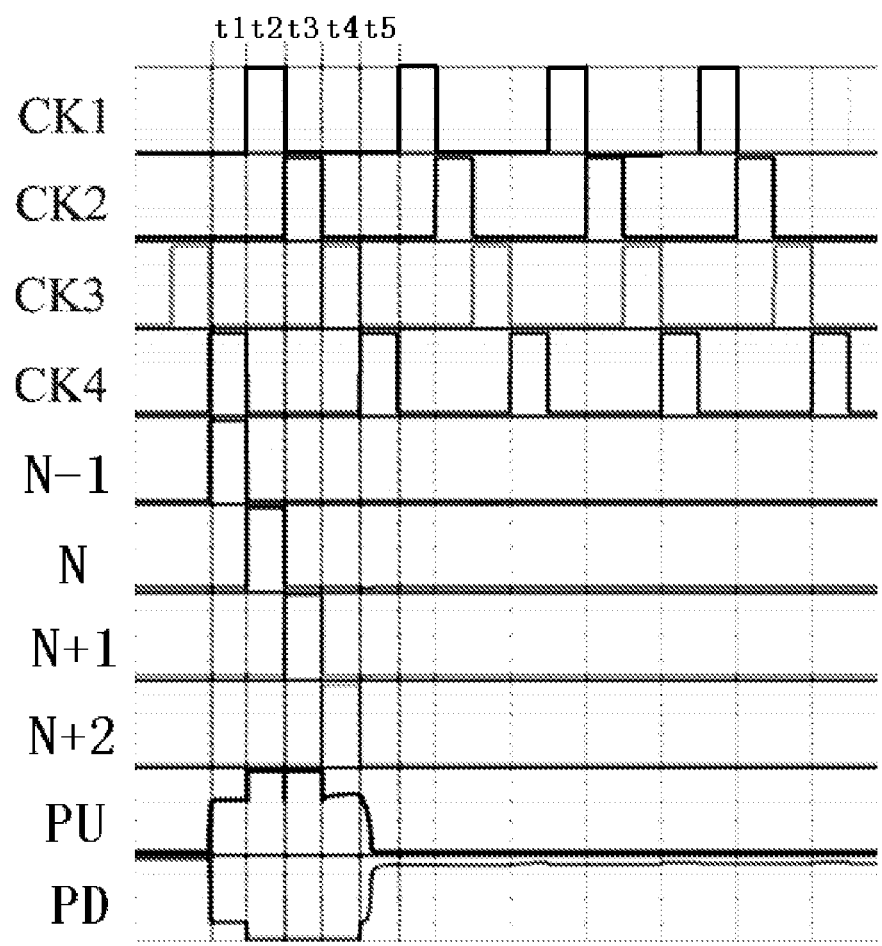
FIG. 4 is a timing diagram of a GOA according to an embodiment of the present disclosure.

According to an embodiment of the present disclosure, there is also provided a method for driving a GOA circuit. FIG. 4 shows a timing diagram of signals according to an embodiment of the present disclosure. The method will be described below with reference to FIG. 4. According to this embodiment of the driving method, in the first phase t1, the first input module 1 charges the pull-up node PU under control of the signal input from the first signal input terminal Input1. The second reset module 6 pulls down the pull-down node under control of the fourth clock signal input from the reset clock signal input terminal CK4. The second noise reduction module 5 performs noise reduction on the pull-down node PD through the signal input from the reference potential terminal VGL under control of the potential of the pull-up node PU. The first output module 2 outputs a low-level signal.

That is, in the phase t1, Input1 (signal N−1) of the first stage is high, CK1, CK2, CK3 are low, and CK4 is high. Thus, M11 is turned on, and Input1 (N−1) charges M1 through M11 and charges C2. Thus the potential of the node PU is changed to high level, so that M5 becomes conductive. Thus, C3 begins to discharge, and PD is pulled low. In addition, since the potential of the node PU becomes a high level, M2 is conductive, and CK1 and Out1 (the signal thereof is here illustrated as signal N) is connected, and Out1 (N) is maintained at a low level. Likewise, M9 is turned on, CK2 is connected to Out2 (the signal thereof is shown here as signal N+1), and Out2(N+1) is also kept low.

In the second phase t2, the first output module 2 outputs the signal input from the first clock control signal terminal CK1 through the first signal output terminal Out1 under control of the potential of the pull-up node PU. The second noise reduction module 5 performs a noise reduction on the pull-down node PD through the signal input from the reference potential terminal VGL under control of the signal input from the first signal output terminal Out1.

That is, in the phase t2, the signal N−1 is changed to a low level, CK1 is changed to a high level, and CK2, CK3, and CK4 are at low level. Thus, M11 is turned off. Here, the capacitors C1 and C2 ensure the high potential and boot of the node PU. Signal N is changed with CK1 and becomes high. Signal N+1 remains low. M4 is turned on as the signal N goes high. With the feedback through M4, output stability can be increased and noise can be reduced.

In the third phase t3, the second output module 2 outputs the signal input from the second clock control signal terminal CK2 through the second signal output terminal Out2 under control of the potential of the pull-up node PU. The second noise reduction module 5 performs a noise reduction on the pull-down node PD through the signal input from the reference potential terminal VGL under control of the signal input from the second signal output terminal Out2.

That is, in this phase, signal CK1 is changed to low level, CK2 is changed to high level, and CK3 and CK4 are at low level. Signal N is changed with CK1, and becomes low. The signal N+1 is changed with CK2, and becomes high; and it turns on the switch M10. Signal N+1 is feedback through M10, and thus output stability can be increased and noise can be reduced.

In the fourth phase t4, the second output module 2 outputs the signal input from the third clock control signal terminal CK3 through the second signal output terminal Out2 under control of the potential of the pull-up node PU. The second noise reduction module 5 performs a noise reduction on the pull-down node PD through the signal input from the reference potential terminal VGL under control of the potential of the pull-up node PU.

In other words, in this phase, CK1 is at low level, CK2 is at low level, CK3 is at high level, CK4 is at low level, and the signal N+2 at the input 2 of the shift register of level 1 (that is, the signal at the output OUT1 of the shift register fo stage 2) is at high level. M1 is turned on, and the signal N+2 at Input2 passes through M1 and continues to charge C1 and C2 so that the potential at the node PU continues to maintain a high level. As a result, the switch M5 continues to be on, ensuring that the PD continues to be held low.

In the fifth phase t5, the second reset module 6 pulls the potential at the pull-down node up to high under control of the fourth clock signal CK4 input from the reset clock signal input terminal. The first reset module 3 pulls down the potentials of the first signal output terminal Out1 and the second signal output terminal Out2 through the signal input from the reference potential terminal VGL under control of the potential of the pull-down node PD.

That is, in this phase, signal N+2 becomes low, CK1, CK2, and CK3 become low, and CK4 is at high level. M1 is turned off and M7 is turned on. CK4 charges C3 through M7. The voltage at the node PD thus becomes a high level, causing M6 to be turned on. As a result, the capacitors C1 and C2 is discharged through the M6, and the node PU is pulled down to a low level, so that the switches M2 and M9 are turned off. Since the voltage at the node PD changes to a high level, M3 and M8 turn on, ensuring that the signal N and the signal N+1 continue to output a low level.

The above-described operation can be suitably applied to the operations of other stages.

According to an embodiment of the present disclosure, there is also provided a display panel which includes the shift register according to the above embodiment(s) or other embodiment(s). Here, as an example of a display panel, a liquid crystal display panel, an OLED display panel, an electrophoretic display panel, an electronic ink display panel, and the like can be given.

According to an embodiment of the present disclosure, there is provided a display device including the above-described display panel. The display device may comprise, but not be limited to, any product or component having a display function, such as liquid crystal display panel, electronic paper, mobile phone, tablet computer, television set, display, notebook computer, digital photo frame, navigator, and the like.

Obviously, the above-mentioned embodiments can be varied or modified or can be combined, when they are specifically implemented; for example, although two output modules are illustrated in the foregoing embodiments, such a case where three or more output modules are included may be similar to those foregoing embodiments, and thus is also embraced within the scope of this disclosure.

It is to be understood that the above embodiments are merely exemplary embodiments adopted for explaining the principle of the present disclosure, and the present disclosure shall not be limited thereto. The embodiments disclosed herein can be combined as appropriate without departing from the spirit and scope of the present disclosure. For a person of ordinary skill in the art, various variations and modifications can be made without departing from the spirit and essence of the present disclosure, and these variations and modifications are also considered to be embraced within the scope of the present disclosure. The scope of the inventions shall be defined only by the appended claims.

The invention claimed is:

1. A shift register comprising:
at least one input sub-circuit, each input sub-circuit being connected to a pull-up node and a respective signal input terminal for charging the pull-up node under control of an input signal input from the respective signal input terminal;
at least one output sub-circuit, each output sub-circuit being connected to the pull-up node, a respective signal output terminal, a respective clock control signal terminal, and a respective first reset sub-circuit for outputting a respective clock signal input from the respective clock control signal terminal through the respective signal output terminal under control of a potential of the pull-up node;
a first reset sub-circuit corresponding to each of the at least one output sub-circuit, each first reset sub-circuit being connected to a pull-down node, a reference potential terminal, and a first signal output terminal corresponding to the respective output sub-circuit, for pulling the potential of the respective signal output terminal down to a reference potential under control of a potential of the pull-down node;
a first noise reduction sub-circuit connected to the reference potential terminal, the pull-down node, and the pull-up node, for performing noise reduction on the pull-up node through a signal input from the reference potential terminal under control of the potential of the pull-down node; and
a second noise reduction sub-circuit connected to the pull-down node, the pull-up node, the reference potential terminal, and each of the at least one signal output terminal, for performing noise reduction on the pull-down node through a signal input from the reference potential terminal under control of signal(s) output from the at least one signal output terminal and the potential of the pull-up node; and
a second reset sub-circuit connected to a reset clock signal input terminal and the pull-down node, for controlling the potential of the pull-down node under control of a signal input from the reset clock signal input terminal, wherein the at least one output sub-circuit comprises two output sub-circuits each comprising a second transistor and a first capacitor,
a control electrode of the second transistor being connected to the pull-up node; a second electrode of the second transistor being connected to a respective signal output terminal and a respective first reset sub-circuit, and a first electrode of the second transistor being connected to a respective clock control signal terminal; and
a first end of the first capacitor being connected to the pull-up node, and a second end of the first capacitor being connected to a respective signal output terminal,
the two output sub-circuits include a first output sub-circuit and a second output sub-circuit which respectively receive a first clock signal and a second clock signal through the respective clock control signal terminals;
the second reset sub-circuit receives a fourth clock signal through the reset clock signal input terminal, and
the second clock signal has a same frequency as and a phase difference of ¼ cycle from the first clock signal, and
the fourth clock signal has a same frequency as and a phase difference of ¾ cycles from the first clock signal.

2. The shift register of claim 1, wherein the at least one input sub-circuit comprises two input sub-circuits each comprising a first transistor, a control electrode and a first electrode of the first transistor being connected to a respective signal input terminal corresponding to the input sub-circuit, the second electrode of the first transistor being connected to the pull-up node.

3. The shift register according to claim 1, wherein the first reset sub-circuit comprises a third transistor, a control electrode of the third transistor being connected to the pull-down node, and a first electrode of the third transistor being connected to a respective signal output terminal, and a second electrode of the third transistor being connected to the reference potential terminal.

4. The shift register according to claim 1, wherein
the second noise reduction sub-circuit comprises a fourth transistor, a fifth transistor and a second capacitor (c3);
a control electrode of the fourth transistor is connected to a respective signal output terminal, a first electrode of the fourth transistor is connected to the pull-down node, and a second electrode of the fourth transistor is connected to the reference potential terminal;
a control electrode of the fifth transistor is connected to the pull-up node, a first electrode of the fifth transistor is connected to the pull-down node, and a second electrode of the fifth transistor is connected to the reference potential terminal;
a first end of the second capacitor is connected to the pull-down node, and a second end of the second capacitor is connected to the reference potential terminal.

5. The shift register according to claim 1, wherein
the first noise reduction sub-circuit comprises a sixth transistor;
a control electrode of the sixth transistor is connected to the pull-down node, a first electrode of the sixth transistor is connected to the pull-up node, and a second electrode of the sixth transistor is connected to the reference potential terminal.

6. The shift register according to claim 1, wherein
the second reset sub-circuit comprises a seventh transistor;
a control electrode and a first electrode of the seventh transistor are connected to the reset clock signal input terminal, and a second electrode of the seventh transistor is connected to the pull-down node.

7. The shift register according to claim 1, wherein
the at least one input sub-circuit comprises two input sub-circuits, wherein:
each of the input sub-circuits comprises a first transistor, a control electrode and a first electrode of the first transistor being connected to a signal input terminal corresponding to the respective input sub-circuit, and a second electrode of the first transistor being connected to the pull-up node;
the first reset sub-circuit comprises a third transistor, wherein:
a control electrode of the third transistor is connected to the pull-down node, a first electrode of the third transistor is connected to a respective signal output terminal, and a second electrode of the third transistor is connected to the reference potential terminal;
the first noise reduction sub-circuit comprises a sixth transistor, wherein:
a control electrode of the sixth transistor is connected to the pull-down node, a first electrode of the sixth transistor is connected to the pull-up node, and a second electrode of the sixth transistor is connected to the reference potential terminal;
the second reset sub-circuit comprises a seventh transistor, wherein:
a control electrode and a first electrode of the seventh transistor are connected to the reset clock signal input terminal, and a second electrode of the seventh transistor is connected to the pull-down node; and
the second noise reduction sub-circuit comprises a fourth transistor, a fifth transistor, a tenth transistor and a second capacitor, wherein:
a control electrode of the fourth transistor is connected to a respective signal output terminal, a first electrode of the fourth transistor is connected to the pull-down node, and a second electrode of the fourth transistor is connected to the reference potential terminal;
a control electrode of the fifth transistor is connected to the pull-up node, a first electrode of the fifth transistor is connected to the pull-down node, and a second electrode of the fifth transistor is connected to the reference potential terminal;
a control electrode of the tenth transistor is connected to a respective signal output terminal, a first electrode of the tenth transistor is connected to the pull-down node, and a second electrode of the tenth transistor is connected to the reference potential terminal; and
a first end of the second capacitor is connected to the pull-down node, and a second end of the second capacitor is connected to the reference potential terminal.

8. A circuit for driving pixel units comprising:
a plurality of the shift registers according to claim 1 which are cascaded,
wherein the plurality of cascaded shift registers comprises at least two stages,
wherein a signal output terminal of a shift register of a stage of the at least two stages is connected to a respective signal input terminal of a shift register of a next stage of the at least two stages wherein the respective signal output terminals of the shift registers are configured to output signals for driving respective pixel units.

9. A method for driving a shift register,
wherein the shift register comprises:
   at least one input sub-circuit, each input sub-circuit being connected to a pull-up node and a respective signal input terminal for charging the pull-up node under control of an input signal input from the respective signal input terminal;
   at least one output sub-circuit, each output sub-circuit being connected to the pull-up node, a respective signal output terminal, a respective clock control signal terminal, and a respective first reset sub-circuit for outputting a respective clock signal input from the respective clock control signal terminal through the respective signal output terminal under control of a potential of the pull-up node;
   a first reset sub-circuit corresponding to each of the at least one output sub-circuit, each first reset sub-circuit being connected to a pull-down node, a reference potential terminal, and a first signal output terminal corresponding to the respective output sub-circuit, for pulling the potential of the respective signal output terminal down to a reference potential under control of a potential of the pull-down node;
   a first noise reduction sub-circuit connected to the reference potential terminal, the pull-down node, and the pull-up node, for performing noise reduction on the pull-up node through a signal input from the reference potential terminal under control of the potential of the pull-down node; and
   a second noise reduction sub-circuit connected to the pull-down node, the pull-up node, the reference potential terminal, and each of the at least one signal output terminal, for performing noise reduction on the pull-down node through a signal input from the reference potential terminal under control of signal (s) output from the at least one signal output terminal and the potential of the pull-up node; and
   a second reset sub-circuit connected to a reset clock signal input terminal and the pull-down node, for controlling the potential of the pull-down node under control of a signal input from the reset clock signal input terminal,
wherein the at least one output sub-circuit comprises a first output sub-circuit and a second output sub-circuit which, respectively, receive a first clock signal and a second clock signal through the respective clock control signal terminals,
the method comprising:
in a first phase, setting a signal inputted from a first signal input terminal to be high, a first clock signal to be low, a second clock signal to be low, and a fourth clock signal inputted from the reset clock signal input terminal to be high, so that:
   the first input sub-circuit charges the pull-up node under control of a signal input from the first signal input terminal to pull-down a potential of the pull-down node;
   the second noise reduction sub-circuit performs noise reduction on the pull-down node through a signal input from the reference potential terminal under control of a potential of the pull-up node;
   a low-level signal is output at the first signal output terminal; and
   a low-level signal is output at the second signal output terminal;
in a second phase, setting the signal input from the first signal input terminal to be low, the first clock signal to be high, the second clock signal to be low, and the fourth clock signal to be low, so that:
   the first output sub-circuit, under control of the potential of the pull-up node, outputs the first clock signal through the first signal output terminal,
   the second noise reduction sub-circuit performs noise reduction on the pull-down node through a signal input from the reference potential terminal under control of the signal input from the first signal output terminal;
   a high level signal is output at the first signal output terminal;
   a low-level signal is output at the second signal output terminal;
in a third phase, setting the signal input from the first signal input to be low, the first clock signal to be low, the second clock signal to be high, and the fourth clock signal to be low, so that:
   the second output sub-circuit, under control of the potential of the pull-up node, outputs the second clock signal through the second signal output terminal;
   the second noise reduction sub-circuit performs noise reduction on the pull-down node through the signal input from the reference potential terminal under control of the signal input from the second signal output terminal;
   a low-level signal is output at the first signal output terminal;
   a high level signal is output at the second signal output terminal.

10. A method for driving a Gate Driver on Array (GOA) circuit, wherein
   the GOA circuit comprises first and second shift registers according to claim 1 which are cascaded,
   the first shift register comprises a first output sub-circuit and a second output sub-circuit which receive a first clock signal and a second clock signal respectively from respective clock control signal terminals, and are respectively connected to a first signal output terminal and a second signal output terminal,
   the first shift register comprises a first input sub-circuit and a second input sub-circuit which receive a first input signal and a second input signal respectively from respective first signal input terminals,
   the second shift register comprises a first output sub-circuit and a second output sub-circuit which receive a third clock signal and a fourth clock signal respectively from respective clock control signal terminals, and are respectively connected to a third signal output terminal and a fourth signal output terminal,
   the second reset sub-circuit of the second shift register receives a second clock signal through a reset clock signal input terminal connected thereto;
   the second shift register comprises a first input sub-circuit and a second input sub-circuit which receive a third input signal and a fourth input signal respectively from respective signal input terminals,
   the signal input terminal of the first shift register, from which the second input signal is received, is connected to the third signal output terminal of the second shift register,
   the method comprising:

in a first phase:
the first input sub-circuit charging the pull-up node under control of a signal input from the respective first signal input terminal; and the second reset sub-circuit, under control of the fourth clock signal input from the reset clock signal input terminal, pulling down a potential of the pull-down node;
the second noise reduction sub-circuit performing noise reduction on the pull-down node through a signal input from the reference potential terminal under control of a potential of the pull-up node;
a low-level signal being output at the first signal output terminal;
a low-level signal being output at the second signal output terminal;
in a second phase:
the first output sub-circuit, under control of the potential of the pull-up node, outputting the first clock signal through the first signal output terminal,
the second noise reduction sub-circuit performing noise reduction on the pull-down node through a signal input from the reference potential terminal under control of a signal input from the first signal output terminal;
a high level signal being output at the first signal output terminal;
a low-level signal being output at the second signal output terminal;
in a third phase:
the second output sub-circuit outputting a signal input from the second clock control signal terminal through the second signal output terminal under control of a potential of the pull-up node;
the second noise reduction sub-circuit performing noise reduction on the pull-down node through a signal input from the reference potential terminal under control of a signal input from the second signal output terminal;
a low-level signal being output at the first signal output terminal;
a high level signal being output at the second signal output terminal;
in a fourth phase:
the second output sub-circuit outputting a signal input from the third clock control signal terminal through the second signal output terminal under control of a potential of the pull-up node;
the second noise reduction sub-circuit performs noise reduction on the pull-down node through a signal input from the reference potential terminal under control of a potential of the pull-up node;
a high level signal being output at the first signal output terminal;
a low-level signal being output at the second signal output terminal;
in a fifth phase:
the second reset sub-circuit pulling a potential at the pull-down node to high under control of a signal input from the reset clock signal input terminal;
the first reset sub-circuit pulling potentials of the first signal output terminal and the second signal output terminal to low through a signal input from the reference potential terminal under control of a potential of the pull-down node.

11. The method according to claim 10, wherein:
the first clock signal, the second clock signal, the third clock signal, and the fourth clock signal have a same frequency and their phases are sequentially different by ¼ cycle.

12. A display device comprising:
an array substrate;
a driving circuit comprising the shift register according to claim 1 on the array substrate; and
pixel units,
wherein the driving circuit is configured to drive the pixel units.

* * * * *